United States Patent [19]

Gontowski, Jr.

[11] Patent Number: 4,791,315
[45] Date of Patent: Dec. 13, 1988

[54] CROSS-COUPLED LATCH

[75] Inventor: Walter S. Gontowski, Jr., Thompson, Conn.

[73] Assignee: Cherry Semiconductor Corporation, East Greenwich, R.I.

[21] Appl. No.: 58,049

[22] Filed: Jun. 4, 1987

[51] Int. Cl.⁴ .................. H03K 3/286; H03K 3/288
[52] U.S. Cl. .................................. 307/291; 307/292; 307/299.2; 307/300
[58] Field of Search ............ 307/291, 292, 300, 299.2

[56] References Cited

U.S. PATENT DOCUMENTS 3,018,387  1/1962  Beck ..................................... 307/292
3,805,093  4/1974  Hodemaekers ..................... 307/291
4,276,485  6/1981  Rydval ................................. 307/291

Primary Examiner—John Zazworsky
Attorney, Agent, or Firm—Robert M. Asher

[57] ABSTRACT

A cross-coupled latch circuit in which first and second switching transistors are each connected as a current mirror with a diode. The base of each switching transistor is cross-coupled to the collector of the other switching transistor by a resistor and a diode. The collector of each switching transistor is connected to the voltage source terminal by a resistor. The switching transistors are prevented from saturating in their low states so as to increase switching speed.

9 Claims, 2 Drawing Sheets 4,791,315

CROSS-COUPLED LATCH

BACKGROUND OF THE INVENTION

The present invention is directed to a cross-coupled latch. In particular, the latch circuit of the present invention is for use in a current mode controller for high frequency applications.

A typical cross-coupled latch is shown in FIG. 1. The latching circuit includes two cross-coupled switching transistors, 10 and 12. The collector of the first switching transistor 10 is connected to a first resistor 14 in series with a terminal 34 which receives the source voltage 34. The collector of the second switching transistor 12 is connected to a second resistor 16 which is connected in series with the voltage source terminal 34. A first cross-coupling resistor 18 is connected between the collector of the first switching transistor 10 and the base of the second switching transistor 12. A second cross-coupling resistor 20 is connected between the collector of the second switching transistor 12 and the base of the first switching transistor 10. The latching circuit is set by a setting circuit including resistor 26, resistor 28, and transistor 22. The resetting circuit includes resistor 30, resistor 32 and transistor 24.

In operation, a voltage greater than the base emitter voltage is applied to the reset pin at resistor 30. This will cause transistor 24 to conduct bringing the potential at the colector of the second switching transistor 12 to ground. With no base drive available, the first switching transistor 10 is turned off. Base drive current is now available to the second switching transistor 12 through the first resistor 14 and the first cross-coupling resistor 18. This current keeps second switching transistor 12 latched on. Even when the voltage at the reset pin is removed. The circuitry is symmetrical so that the same operation occurs when a voltage greater than the base emitter voltage is applied to the set pin at resistor 26. This will cause a reversal of the states of the switching transistors and switching transistor 10 will be latched on. This typical latching circuit is slow because of the time required to bring the switching transistors out of hard saturation. This makes this latching circuit inappropriate for high speed latching applications.

It is an object of the present invention to provide a latching circuit in which saturation of the switching transistor is avoided so as to provide increased switching speed.

SUMMARY OF THE INVENTION

The latching circuit of the present invention provides a diode between the base and the emitter of each of the switching transistors. The switching transistors are provided with multiple emitters so that the current through the diodes is mirrored and multipled through the switching transistor. An additional diode is also provided in series with each of the cross-coupling resistors. The resistor values in the latching circuit are selected so that the low state for each switching transistor is high enough to avoid saturation yet low enough to prevent base drive current from being provided to the other switching transistor. Since the switching transistors of the present invention are kept out of saturation they can switch at high speeds.

Other objects and advantages of the invention will become apparent during the following description of the presently preferred embodiment of the invention taken in conjunction with the drawings.

DETAILED DESCRIPTION OF THE PREFERRED EMBODIMENT

Figure 2:
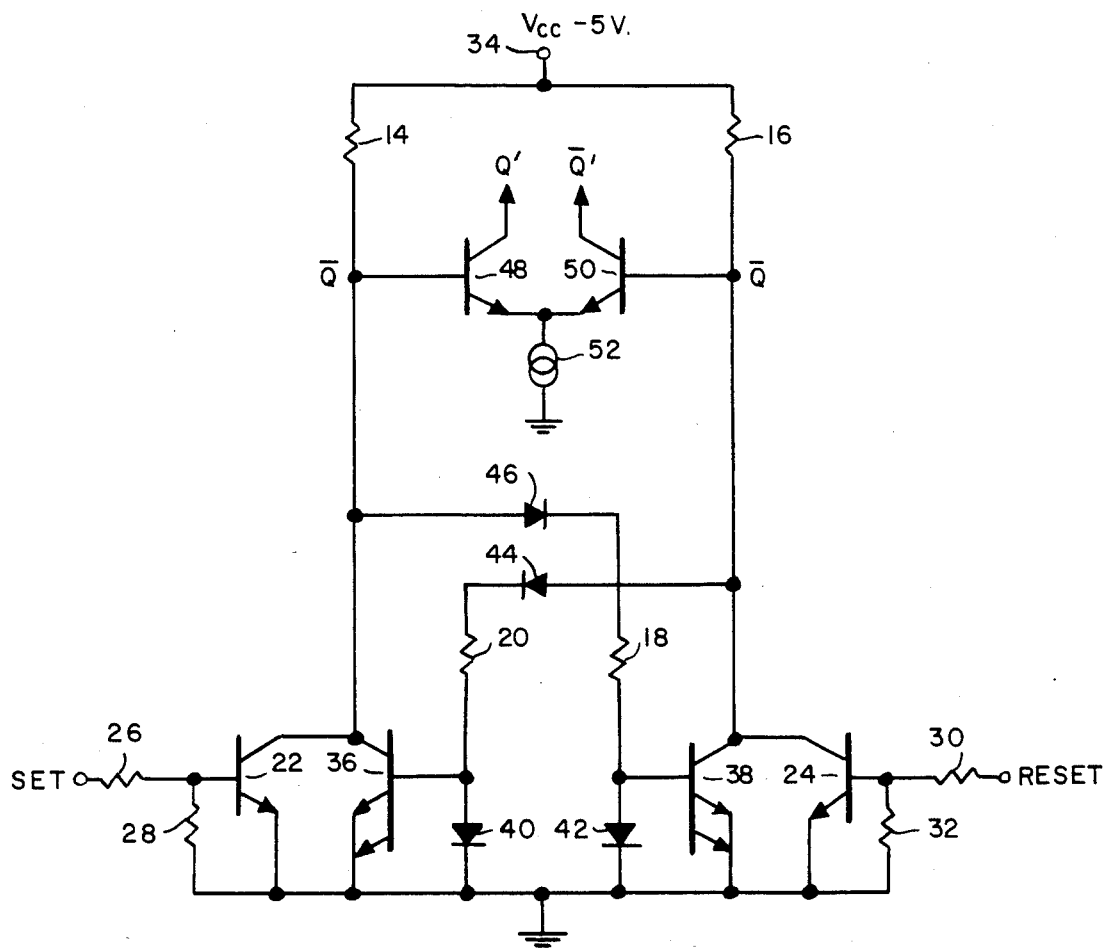
FIG. 2 is a schematic of the latching circuit of the present invention.

Referring now to FIG. 2, a latching circuit of the present invention is shown. Components which correspond to the prior art circuit are given the same numerical labels. The set latch circuitry includes resistor 26, resistor 28, and transistor 22. The reset latch circuit includes resistor 30, resistor 32, and transistor 24. A first switching transistor 36 is connected collector-to-collector and emitter-to-emitter with transistor 22 of the set latch circuitry. A second switching transistor 38 is similarly connected collector-to-collector and emitter-to-emitter with transistor 24 of the reset latch circuit.

In accordance with the present invention, a first diode 40 is connected between the base and the emitter of the first switching transistor 36. The first switching transistor 36 has multiple emitters. In the preferred embodiment it has two emitters. Thus, the current flowing through the first diode 40 is mirrored and multipled by two in the switching transistor 36. Likewise, a second diode 42 is connected between the base and the emitter of second switching transistor 38. The second switching transistor 38 has two emitters for doubling the current which is present in the second diode 42.

The base of the first switching transistor 36 is cross-coupled to the collector of the second switching transistor 38 by a resistor 20 and a diode 44. The base of the second switching transistor 38 is cross-coupled to the collector of the first switching transistor 36 by a resistor 18 and a diode 46. A first resistor 14 is connected between the terminal 34 for receiving the source voltage and the collector of the first switching transistor 36. Thus, there is a series circuit between the voltage source at terminal 34 and ground formed by first resistor 14, diode 46, resistor 18 and second diode 42. Likewise, a second resistor 16 is connected between the collector of second switching transistor 38 and the voltage source terminal 34. Thus, a series circuit is formed between the voltage source at terminal 34 and ground by the second resistor 16, diode 44, resistor 20 and first diode 40. The outputs of the latching circuit are taken from the collectors of the switching circuits. A first output transistor 48 has its base connected to the collector of the first switching transistor 36. A second output transistor 50 has its base connected to the collector of the second switching 38. The emitters of the output transistors are connected to one another and also to a current source 52.

The collectors of the switching transistors switch between high state and a low state. The values of the components of the circuit are selected so that when a switching transistor is at its low state, the voltage at the collector of that switching transistor is high enough to avoid saturation of that switching transistor, yet low enough so base drive current is not provided to the other switching transistor. According to the presently preferred embodiment the voltage source is 5 volts, the first resistor 14 is 20K ohms, the second resistor 16 is 20K ohms, resistor 20 is 16K ohms and resistor 18 is 16K ohms.

The operation of the latching circuit shall now be described with the assumption that in the initial conditions the first switching transistor 36 is at a high state and the second switching transistor 38 is at its low state. Thus, with switching transistor 36 off, the current through the second diode 42 is determined by the series circuit including the voltage source at terminal 34, the first resistor 14, the diode 46, cross-coupling resistor 18 and the second diode 42. In the presently preferred embodiment, the current through second diode 42 will be approximately 100 microamps. Since in the presently preferred embodiment, the second switching transistor 38 has twice the number of emitters, twice the amount of current will flow through the second switching transistor 38. Thus, 200 microamps flow through second switching transistor 38 and the second resistor 16.

This 200 microamp current passes through the second resistor 16 to set the low state voltage at the collector of the second switching transistor 38. In the presently preferred embodiment the voltage across second resistor 16 is 20K ohms×200 microamps or 4 volts. This leaves the collector of the second switching transistor 38 at one volt. One volt is large enough to prevent the second switching transistor 38 from saturating and is low enough such that the biasing voltages of diode 40 and diode 44 have not been overcome. Thus, no base drive current will be provided to the first switching transistor 36. It is thus seen, that the resistance of second resistor 16 was small enough to prevent saturation of the second switching transistor 38 when it is in its low state and large enough to prevent base drive current from being provided to the first switching transistor 36.

Since no base drive current is provided to the first switching transistor 36, second switching transistor 38 remains latched low. The high state at the first switching transistor 36 is 3 volts as determined by the voltage across the first resistor 14 which is 20K ohms×100 microamps or 2 volts. Thus with 3 volts at the base of the first output transistor 48, the first output transistor 48 fully conducts while with one volt at the base of second output transistor 50, the second transistor 50 remains off To switch states, a voltage greater than the base emitter voltage is applied to the set input at resistor 26. This causes transistor 22 to saturate. Thus, current is directed away from the cross-coupling circuit of diode 46 and resistor 18. This shuts off second switching transistor 38 causing its collector voltage to rise rapidly. Since second switching transistor 38 was not in saturation, the rise in voltage takes place in much less time than in the prior art circuit of FIG. 1. As the voltage rises at the collector of the second switching transistor 38, base drive current is provided to the first switching transistor 36 turning it on and latching the second switching transistor 38 off.

Although the transistor 22 does saturate and will require a finite time to come out of saturation, the present circuit is intended for applications which allow sufficient time between set and reset signals to allow transistor 22 and transistor 24 to come out of saturation without affecting the circuit performance.

Figure 1:
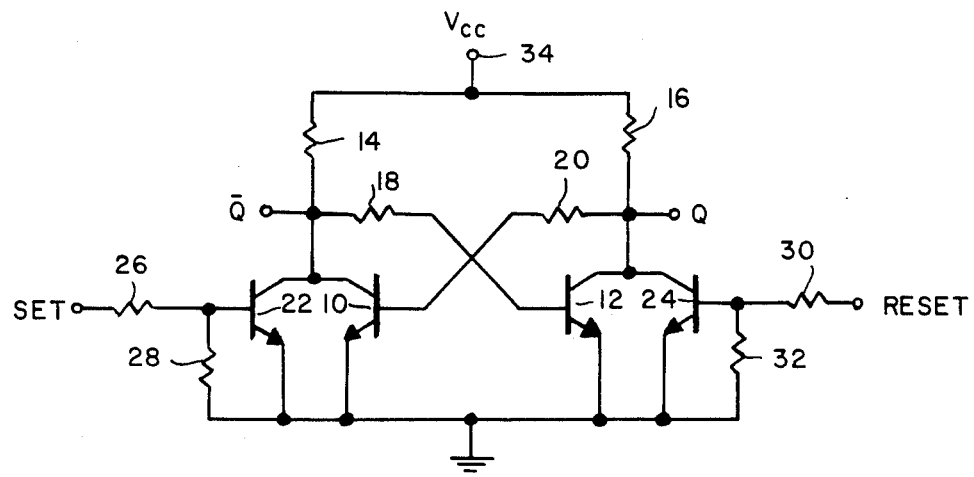
FIG. 1 is a latching circuit of the prior art.
Figure 3A:
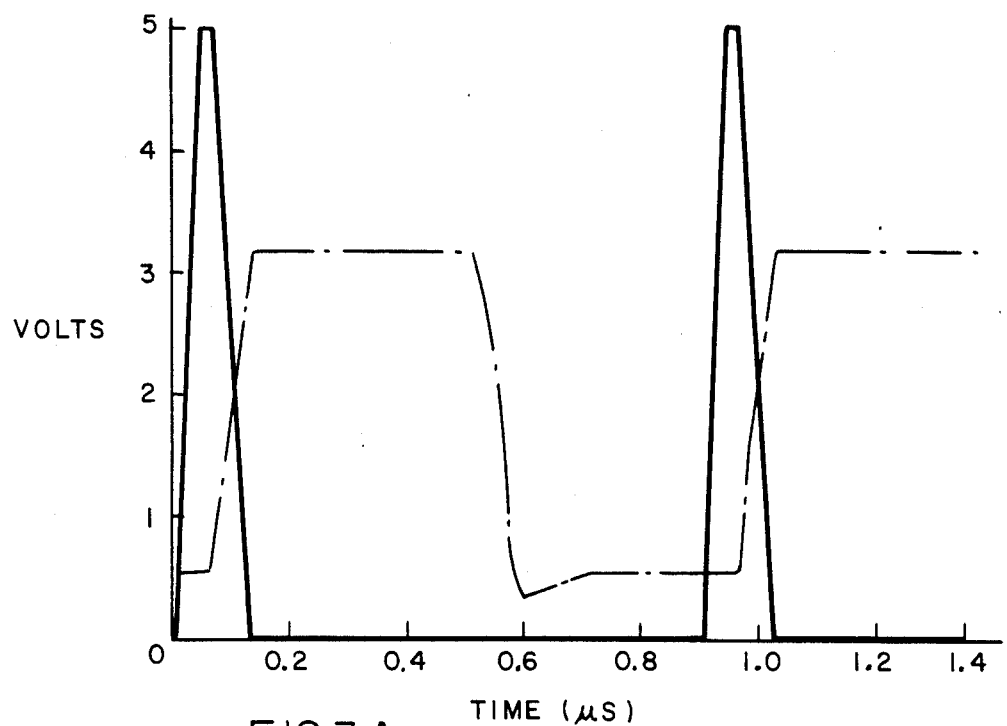
FIGS. 3A and 3B are graphs of voltage versus time for the circuits of FIG. 1 and FIG. 2, respectively.
Figure 3B:
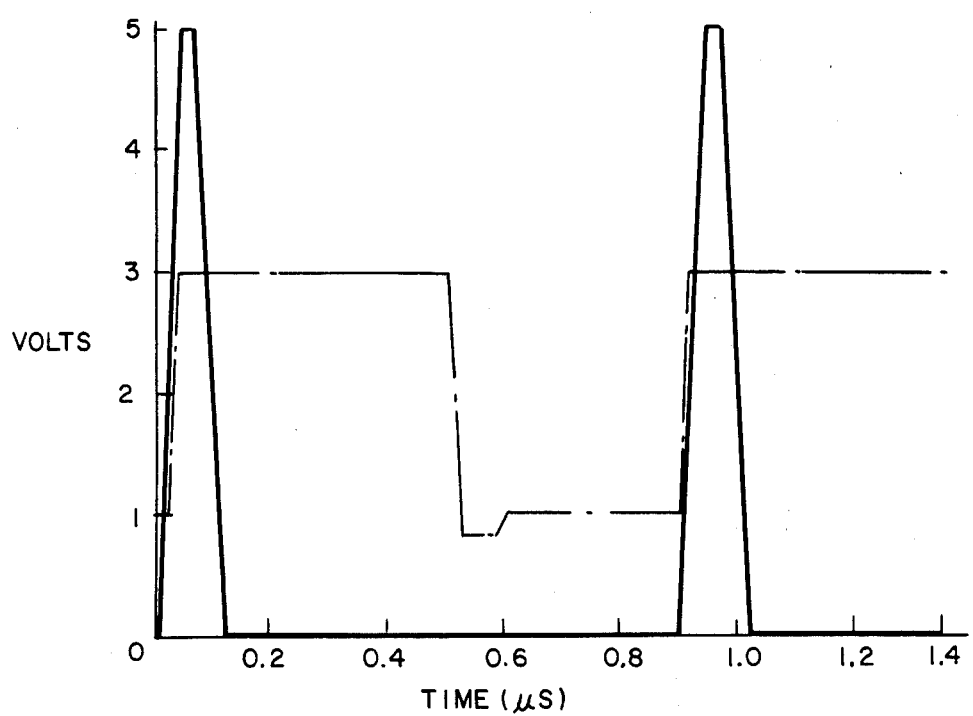

FIGS. 3A and 3B demonstrate the increase in switching speed between the latching circuit of FIG. 1 and the latching circuit of the present invention. The drawings show a computer simulation of the operation of the circuits. FIG. 3A is the prior art circuit operation and FIG. 3B shows the operation of the circuit of the present invention. The solid lines represent the input pulses to the set input terminal, while the broken lines indicate the Q output. Not shown is the pulse supplied to the reset input at approximately 500 nanoseconds that causes the Q output to go low. In the prior art, it takes about 500 nanoseconds before the Q output starts to rise, while the latching circuit of the present invention rises after 5 nanoseconds.

Of course, it should be understood that various changes and modifications to the preferred embodiment described above will be apparent to those skilled in the art. For example, the number of emitters on the switching transistors may be changed and the values of the components may be changed. Also, the components may be replaced by functional equivalents. For example, the diodes may be replaced by transistors suitably connected. These and other changes can be made without departing from the spirit and scope of the invention and without diminishing its attendant advantages. It is therefore intended that such changes and modifications be covered by the following claims.

I claim:

1. A cross-coupled latch circuit comprising:
   means for receiving a voltage;
   a first resistor having one end connected to said voltage receiving means and having an other end;
   a second resistor having one end connected to said voltage receiving means so that said second resistor is in parallel with said first resistor and having an other end;
   a first diode connected in series between said second resistor and ground;
   a second diode connected in series between said first resistor and ground;
   a first switching transistor having a collector coupled to the other end of said first resistor and having a base and emitter connected across said first diode so that the current in said first diode is mirrored and multiplied through said first switching transistor;
   a second switching transistor having a collector coupled to the other end of said second resistor and having a base and emitter connected across said second diode so that the current in said second diode is mirrored and multiplied through said second switching transistor;
   means connected to said first switching transistor for setting said latch circuit; and
   means connected to said second switching transistor for resetting said latch circuit.

2. The latch circuit of claim 1 wherein said first resistor has a value large enough so that current does not flow into said second diode when the collector of said first switching transistor is at a low state and small enough so that said first switching transistor does not saturate when its collector is at the low state.

3. The latch circuit of claim 1 wherein said second resistor has a value large enough so that current does not flow into said first diode when the collector of said second switching transistor is at a low state and small enough so that said second switching transistor does not saturate when its collector is at the low state.

4. The latch circuit of claim 1 further comprising a third diode connected in series with said first diode and connected to the collector of said second switching transistor, said third diode not conducting current when the collector of said second switching transistor is at a low state.

5. The latch circuit of claim 4 further comprising a third resistor connected between said first diode and said third diode.

6. The latch circuit of claim 4 further comprising a fourth diode connected in series with said second diode and connected to the collector of said first switching transistor, said fourth diode not conducting current when the collector of said first switching transistor is at a low state.

7. The latch circuit of claim 6 further comprising a resistor connected between said second diode and said fourth diode.

8. The latch circuit of claim 1 further comprising a first output transistor having a base connected to the collector of said first switching transistor so that said first output transistor is on when the collector of said first switching transistor is at a high state and said first output transistor is off when the collector of said first switching transistor is at a low state.

9. The latch circuit of claim 8 further comprising a second output transistor having a base connected to the collector of said second switching transistor so that said second output transistor is on when the collector of said second switching transistor is at a high state and said second output transistor is off when the collector of said second switching transistor is at a low state.

* * * * *

UNITED STATES PATENT AND TRADEMARK OFFICE
CERTIFICATE OF CORRECTION

PATENT NO. : 4,791,315

DATED : December 13, 1988

INVENTOR(S) : Walter S. Gontowski, Jr.

It is certified that error appears in the above-identified patent and that said Letters Patent is hereby corrected as shown below:

At column 1, line 30, please delete "colector" and insert --collector--.

At column 1, line 36, after the word "on", please delete "." and insert --,--. Please change "Even" to --even--.

At column 2, line 60, after the word "between", please insert --a--.

Signed and Sealed this

Sixth Day of June, 1989

Attest:

DONALD J. QUIGG

Attesting Officer

Commissioner of Patents and Trademarks